United States Patent
Bang

(10) Patent No.: US 7,271,078 B2
(45) Date of Patent: Sep. 18, 2007

(54) METHOD FOR FABRICATING SEMICONDUCTOR DEVICE AND SEMICONDUCTOR DEVICE USING THE SAME

(75) Inventor: Ki Wan Bang, Cheongju (KR)

(73) Assignee: Dongbu Electronics Co., Ltd., Seoul (KR)

( * ) Notice: Subject to any disclaimer, the term of this patent is extended or adjusted under 35 U.S.C. 154(b) by 160 days.

(21) Appl. No.: 11/172,190

(22) Filed: Jun. 29, 2005

(65) Prior Publication Data

US 2006/0003558 A1    Jan. 5, 2006

(30) Foreign Application Priority Data

Jun. 30, 2004    (KR) ............... 10-2004-0050360

(51) Int. Cl.
*H01L 21/04* (2006.01)
(52) U.S. Cl. .................. 438/510; 257/47; 216/48
(58) Field of Classification Search ......... 438/510, 438/710, 723; 257/47, 288; 216/48, 55, 216/62, 67
See application file for complete search history.

(56) References Cited

U.S. PATENT DOCUMENTS

| | | | |
|---|---|---|---|
| 5,518,941 A * | 5/1996 | Lin et al. ............... | 438/291 |
| 5,856,225 A | 1/1999 | Lee et al. | |
| 5,856,226 A | 1/1999 | Wu | |
| 5,960,270 A | 9/1999 | Misra et al. | |
| 6,001,695 A | 12/1999 | Wu | |
| 6,024,887 A * | 2/2000 | Kuo et al. ............... | 216/48 |
| 6,114,206 A | 9/2000 | Yu | |
| 6,169,315 B1 | 1/2001 | Son | |
| 6,180,468 B1 | 1/2001 | Yu et al. | |
| 6,214,677 B1 | 4/2001 | Lee | |
| 6,245,618 B1 | 6/2001 | An et al. | |
| 6,319,807 B1 | 11/2001 | Yeh et al. | |
| 6,406,963 B2 | 6/2002 | Woerlee et al. | |
| 6,518,113 B1 | 2/2003 | Buynoski | |
| 6,562,687 B1 | 5/2003 | Deleonibus et al. | |
| 2005/0196947 A1 * | 9/2005 | Seo et al. ............... | 438/589 |

FOREIGN PATENT DOCUMENTS

KR    1999-0081482    11/1999

OTHER PUBLICATIONS

C.C. Wu, C.H. Diaz, B.L. Lin, S.Z. Chang, C.C. Wang, J.J. Liaw, C.H. Wang, K.K. Young, K.H. Lee, B.K. Liew and J.Y.C. Sun: Ultra-Low Leakage 0.16μm CMOS for Low-Standby Power Applications; IEDM 99; 1999, pp. 28.2.1-28.2.4; IEEE.

(Continued)

*Primary Examiner*—Phuc T. Dang
(74) *Attorney, Agent, or Firm*—Andrew D. Fortney

(57) ABSTRACT

A method for fabricating a semiconductor device improves off-state leakage current and junction capacitance characteristics in a pMOS transistor. The method includes forming a device isolation layer defining an active area in a semiconductor substrate; and forming a channel ion implantation layer by an implantation of arsenic ions in a predetermined region of the active area of the semiconductor substrate at a predetermined density, the channel ion implantation layer having a predetermined doping profile according to the predetermined density of arsenic ion implantation. The implantation may be a low-density implantation of $1.0\times10^{12}\sim1.5\times10^{13}$ atoms/cm$^2$ performed at an energy level of 10~100keV.

20 Claims, 7 Drawing Sheets

OTHER PUBLICATIONS

Sang-Hun Seo, Won-Suk Yang, Han-Sin Lee, Moo-Sung Kim, Kwang-Ok Koh, Seung-Hyun Park and Kyeong-Tac Kim: A Novel Double Offset-Implanted Source/Drain Technology for Reduction of Gate-Induced Drain-Leakage with 0.12μm Single-Gate Low-Power SRAM Device; IEEE Electron Device Letters; Dec. 2002; pp. 719-721; vol 23, No. 0.: IEEE.

Naruhisa Miura, Yuji Abe, Kohei Sugihara, Toshiyuki Oishi, Taisuke Furukawa, Takumi Nakahata, Katsuomi Shiozawa, Shigemitsu Maruno and Yasunori Toduka; Junction Capacitance Reduction Due to Self-Aligned Pocket Implantation in Elevated Source/Drain NMOSFETs; IEEE Transactions on Electron Devices, Sep. 2001; pp. 1969-1974; vol. 46, No. 9.: IEEE.

* cited by examiner

METHOD FOR FABRICATING SEMICONDUCTOR DEVICE AND SEMICONDUCTOR DEVICE USING THE SAME

CROSS-REFERENCE TO RELATED APPLICATIONS

This application claims the benefit of Korean Application No. 10-2004-0050360 filed on Jun. 30, 2004, which is hereby incorporated by reference as if fully set forth herein.

BACKGROUND OF THE INVENTION

1. Field of the Invention

The present invention relates to a semiconductor device, and more particularly, to a method for fabricating a semiconductor device, e.g., a positive-channel metal oxide semiconductor (pMOS) transistor device having improved leakage current ($I_{off}$) and junction capacitance characteristics.

2. Discussion of the Related Art

In fabricating a semiconductor device, for example, a pMOS device for use in portable electronics devices, there is a trade-off between high-performance and low off-state leakage current characteristics of the pMOS device. To achieve high-performance (e.g., high-speed) characteristics, the leakage current may be decreased by suppressing a gate-induced drain leakage current to achieve a balanced interrelationship (i.e., a "tuning") of a gate poly oxide layer, a spacer, etc. Leakage current may also be controlled through the process of forming a lightly doped drain and the wafer cleaning conditions. Such methods are disclosed, for example, in "Ultra-low Leakage 0.16 µm CMOS for Low Standby Power Applications" (IEEE International Electron Devices Meeting (IEDM) Technical Digest, 1999, pp. 671-674) by C. C. Wu et al. and in "A Novel Double Offset-implanted Source/Drain Technology for Reduction of Gate-induced Drain Leakage with 0.12 µm Single-gate Low-power SRAM Device" (IEEE Letters, 2002, Vol. 23, pp. 719-721) by Sang-hun Seo et al. Another method for decreasing leakage current is disclosed in "Junction Capacitance Reduction Due to Self-aligned Pocket Implantation in Elevated Source/Drain NMOSFETs" (IEEE Transactions, 2001, Vol. 48, pp. 1969-1974) by Naruhisa Miura et al. Such methods, however, are costly and involve processes requiring time-consuming set-ups.

SUMMARY OF THE INVENTION

Accordingly, the present invention is directed to a method for fabricating a semiconductor device and semiconductor device using the same that substantially obviates one or more problems due to limitations and disadvantages of the related art.

An object of the present invention is to provide a method for fabricating a semiconductor device, which decreases an off-state leakage current of a PMOS transistor.

Another object of the present invention is to provide a method for fabricating a semiconductor device, which decreases a junction capacitance of a PMOS transistor.

Another object of the present invention is to provide a method for fabricating a semiconductor device, which exhibits improved PMOS device characteristics, including is reduced off-state leakage current and junction capacitance, without transistor performance degradation or additional processing.

Another object of the present invention is to provide a method for fabricating a semiconductor device, which uses channel engineering to realize an improved PMOS device exhibiting reduced off-state leakage current and reduced junction capacitance.

Another object of the present invention is to provide a method for fabricating a semiconductor device, which increases chip speed.

Another object of the present invention is to provide a method for fabricating a semiconductor device, which enables pMOS device fabrication using a simple cost-effective technique.

Another object of the present invention is to provide a semiconductor device suitable for any one of the above fabrication methods.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages in accordance with the purpose of the invention, as embodied and broadly described herein, there is provided a method for fabricating a semiconductor device, comprising forming a device isolation layer defining an active area in a semiconductor substrate; and forming a channel ion implantation layer by an implantation of arsenic ions in a predetermined region of the active area of the semiconductor substrate at a predetermined density, the channel ion implantation layer having a predetermined doping profile according to the predetermined density of arsenic ion implantation.

According to the present invention, the implantation may be an implantation of $1.82 \times 10^{13}$ atoms/cm$^2$ performed at an energy level of 110 keV but is preferably a low-density implantation of $1.0 \times 10^{12} \sim 1.5 \times 10^{13}$ atoms/cm$^2$ performed at an energy level of 10~100 keV, to reduce off-state leakage current and junction capacitance.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, like reference numbers will be used throughout the drawings to refer to the same or similar parts.

Low off-state leakage current ($I_{off}$) can be obtained by increasing threshold voltage ($V_{th}$), but an increased threshold voltage results in higher gate edge junction leakage currents. Therefore, the present invention applies channel engineering to control the profile of a doped channel, namely, a channel ion implantation layer, to control the levels of gate edge junction leakage current. Also, the channel ion implantation process of the present invention can improve the chip's operating speed.

Figure 1A:
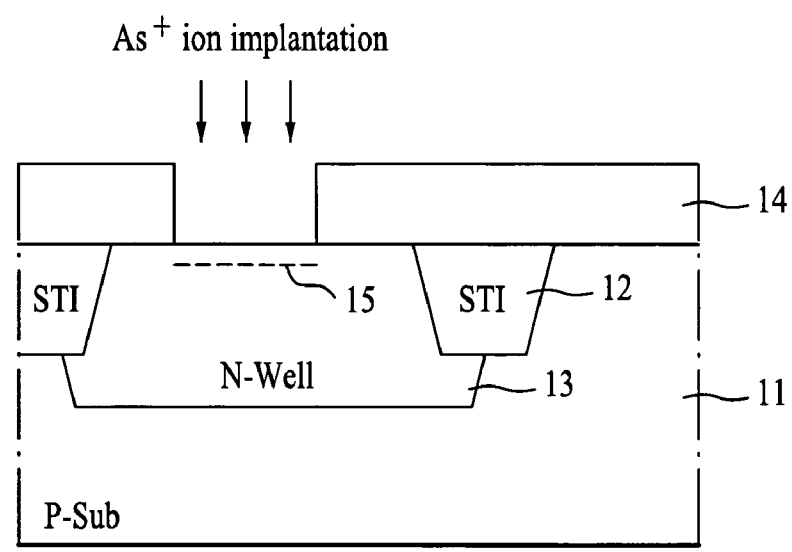
FIGS. 1A and 1B are cross-sectional views illustrating a method for fabricating a pMOS transistor according to the present invention.

Referring to FIG. 1A, illustrating a pMOS transistor fabricated using 0.18 μm logic technology, an active area is defined by forming an N-well 13 in a p-type semiconductor substrate 11 having a shallow trench isolation (STI) layer 12, i.e., a device isolation layer. Then, a photoresist 14 of a reverse gate pattern for As$^+$ ion implantation is formed on the p-type semiconductor substrate 11, which is thus doped with arsenic ions using the photoresist as a mask to form a channel ion implantation layer 15 in a predetermined region of the semiconductor substrate exposed by the photoresist pattern. The channel is then activated by annealing in a nitrogen (N$_2$) gas ambient of 1,025° C. using a rapid thermal annealing technique.

Figure 1B:
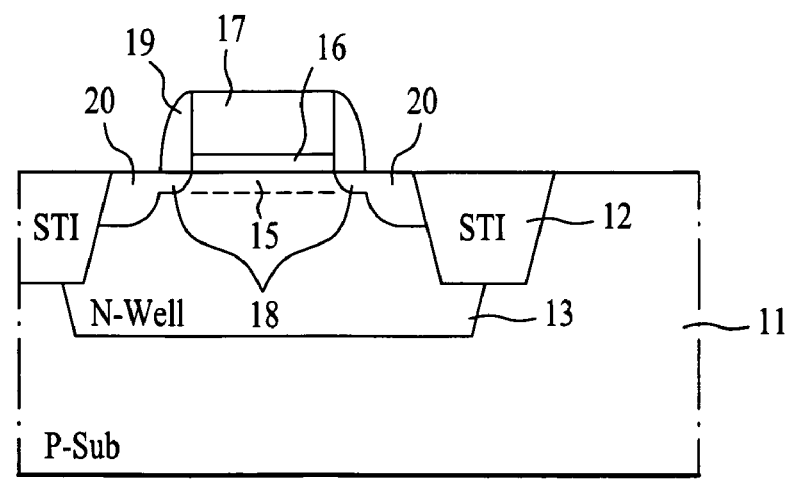

As shown in FIG. 1B, after removing the photoresist 14, a gate oxide layer 16 is grown on the semiconductor substrate 11 and a polysilicon film is deposited to a thickness of 210 nm and patterned to form a gate 17 disposed above the channel ion implantation layer 15. The pattern of the gate 17 is used as a mask to form in the semiconductor substrate 11 a lightly doped drain 18 by implanting lightly doped impurities on either side of the gate pattern, and spacers 19 are then formed on the sidewalls of the gate, so that the gate and spacers can be used as mask when implanting impurities to form a source/drain region 20. Device fabrication is completed by processes for forming a cobalt salicide layer (not shown), an interlayer dielectric material (not shown), and a metallization layer (not shown).

In the method for fabricating a semiconductor device as described above, the ion implantation is controlled to produce variously engineered channels, that is, to produce a predetermined profile of the doped channel. For example, according to the present invention, a low power (LP) device can be realized by performing As$^+$ ion implantation at a density of $1.82 \times 10^{13}$ atoms/cm$^2$ and at an energy level of 110 keV, whereas a new low power (NLP) device can be realized by performing As$^+$ ion implantation at a density of $10 \times 10^{12}$ ~ $1.5 \times 10^{13}$ atoms/cm$^2$ at an energy of 10~100 keV. According to the LP device fabrication method of the present invention, the resulting pMOS device exhibits an off-state leakage current of about 10 pA/μm or less. Meanwhile, the NLP device fabrication method of the present invention, which adopts a low doping density and a low doping energy, can achieve off-state leakage currents of less than 0.5 pA/μm, thereby enabling a reduction in gate edge junction leakage current as exhibited by a pMOS device fabricated according to the present invention. In fact, off-state leakage currents of as little as about 0.2 A/μm can be reached.

Table 1 compares pMOS transistors fabricated in accordance with the method of the present invention.

TABLE 1

| pMOS parameter | LP device | NLP device |
| --- | --- | --- |
| power voltage ($V_{dd}$) | 1.8 V | 1.8 V |
| threshold voltage | 0.60 V | 0.60 V |
| driving current ($I_{dsat}$) | 185 μA/μm | 185 μA/μm |
| gate oxide layer thickness | 28 Å | 28 Å |
| gate length | 0.18 μm | 0.18 μm |
| Maximum leakage current | 10 pA/μm | 0.5 pA/μm |

As can be seen, the LP and NLP devices exhibit very comparable characteristics except for the maximum leakage current characteristic. Here, given a gate length of 0.18 μm, the maximum leakage current of the NLP device is significantly lower than that of the LP device.

Figure 2:
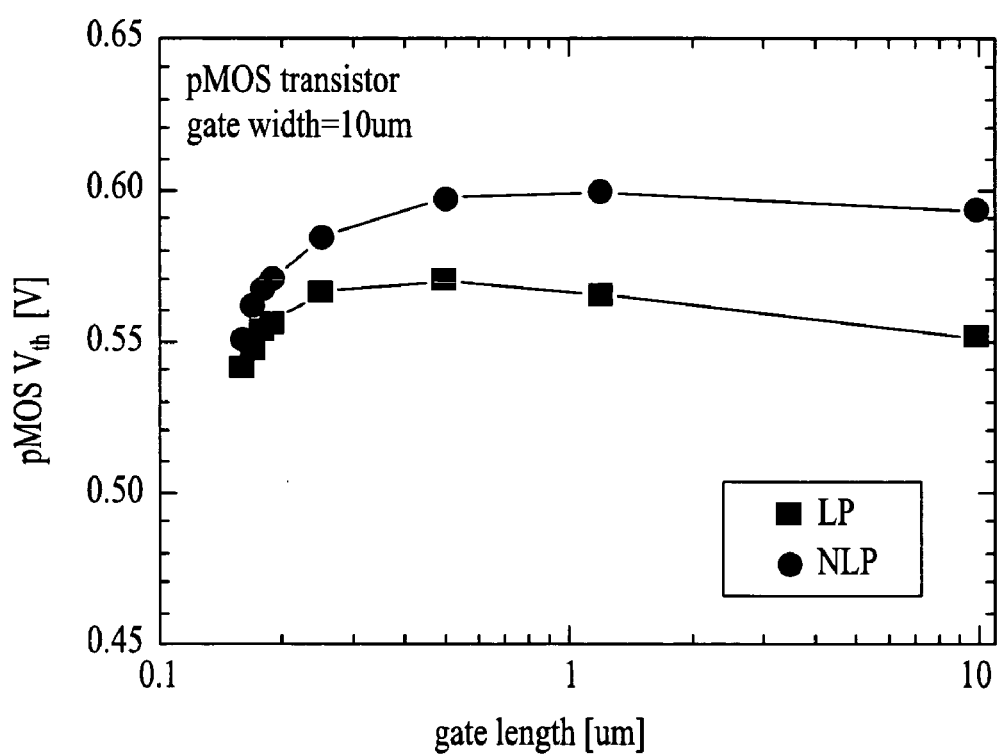
FIG. 2 is a graph showing threshold voltage roll-off characteristics according to gate length of pMOS transistors fabricated in accordance with the method of the present invention.

Referring to FIG. 2, the NLP device exhibits greater threshold voltage roll-off characteristics. Meanwhile, short channel effects of about 5 mV and 6 mV, respectively, can be achieved for the LP and NLP devices of the present invention. On the other hand, the reverse short channel effects of the NLP device, at 5 mV, are superior to the 25 mV of the LP device.

Figure 3:
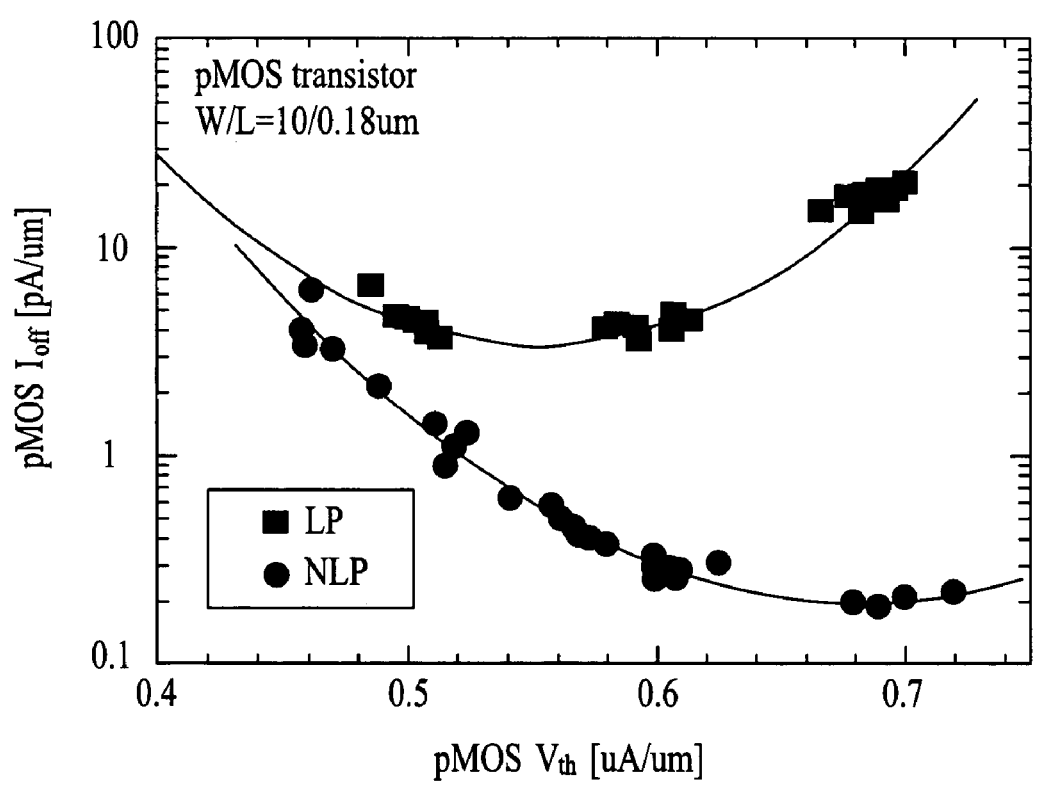
FIG. 3 is a graph showing off-state currents according to threshold voltage of pMOS transistors fabricated in accordance with the method of the present invention.

FIG. 3 demonstrates that the off-state current ($I_{off}$) of the LP device of the present invention is largely independent of the threshold voltage ($V_{th}$), which is an abnormal condition, since the off-state current is generally determined by the three contributing factors of sub-threshold leakage current, gate direct-tunneling leakage current, and source/drain junction leakage current. Thus, to suppress the sub-threshold leakage current, the LP device adopts a higher level of channel doping (e.g., compared to that of a general logic device), which unfortunately also increases the gate edge junction leakage current. Controlling the channel doping profile can prevent this increase in leakage (i.e., off-state) current. That is, as shown in FIG. 3, the leakage current of the NLP device of the present invention can be very well controlled by varying the threshold voltage of a pMOS transistor having a predetermined profile of the doped channel.

Figure 4:
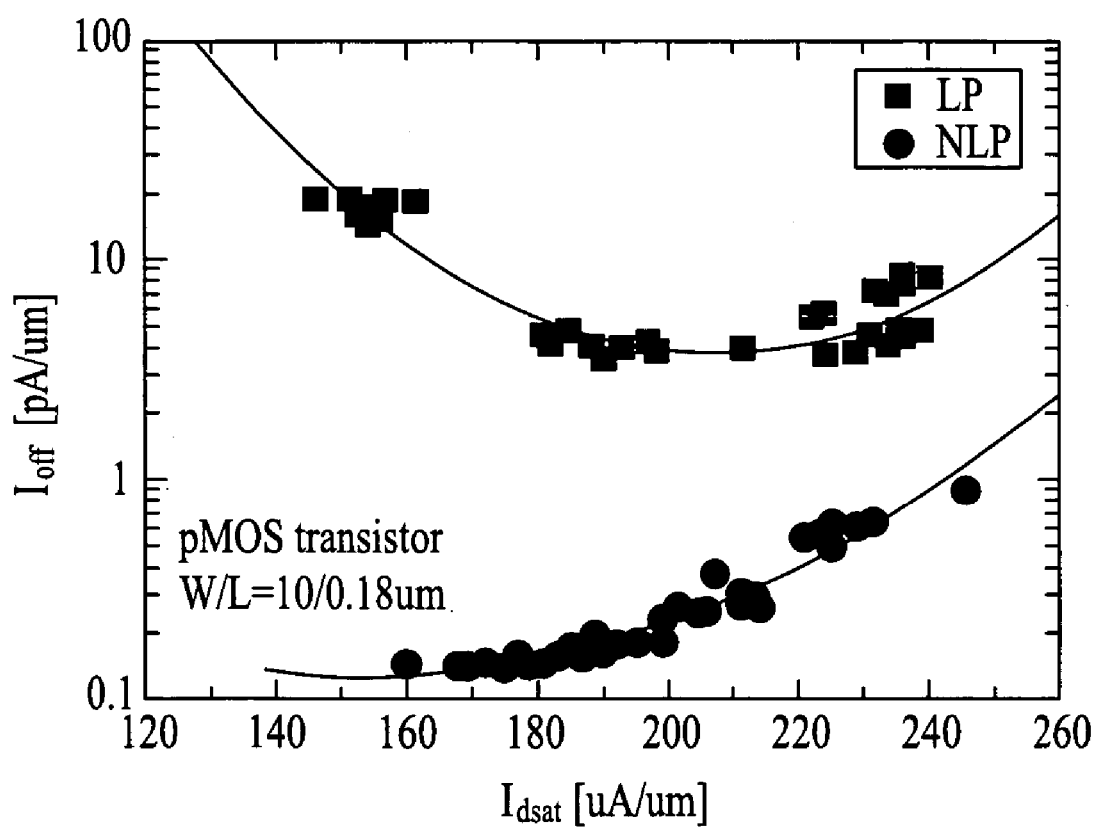
FIG. 4 is a graph showing off-state currents according to drive current in pMOS transistors fabricated in accordance with the method of the present invention.

FIG. 4 demonstrates that the NLP device can improve the off-state current characteristic, which is as much as ten times lower than that of the LP device for a targeted drive current, without degrading transistor performance. Here, the drive current is represented as a drain saturation current ($I_{dsat}$), and the pMOS transistors exhibit a width/length (W/L) characteristic of 10 μm/0.18 μm. As shown in FIG. 4, the capacity (drain saturation current) of a transistor of the NLP device of the present invention can be maintained, i.e., no reduction in the driving current, even with an increase in off-state current.

Figure 5:
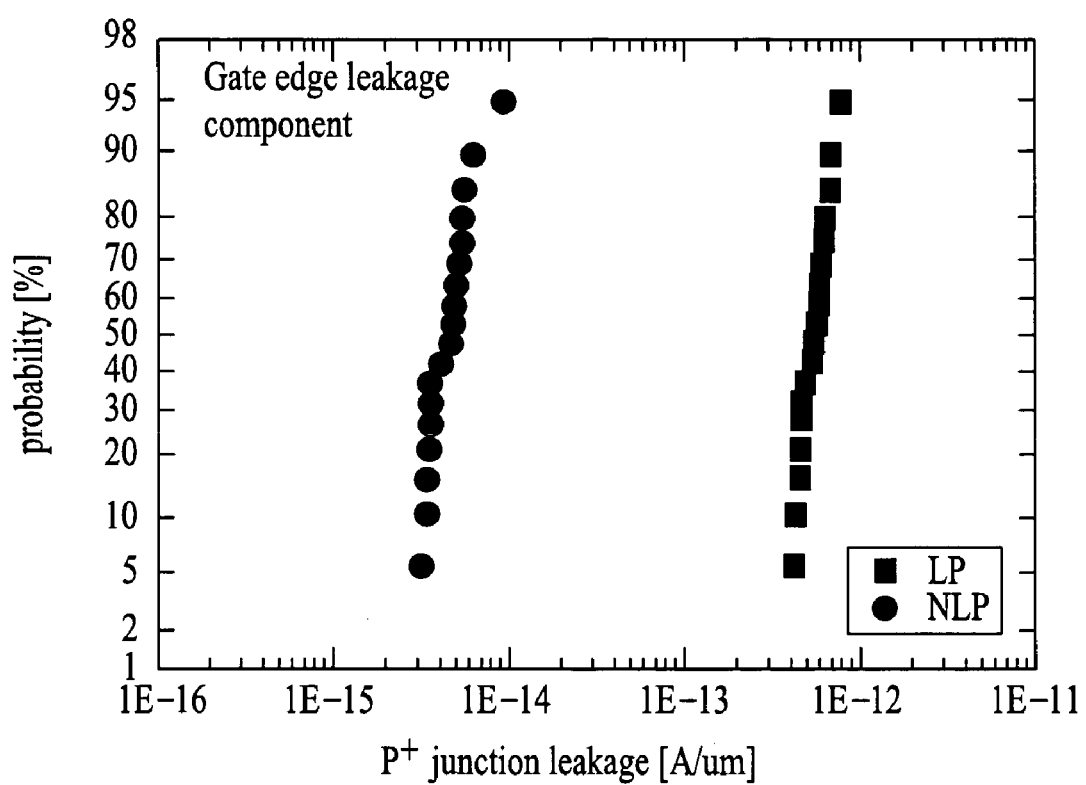
FIG. 5 is a graph for illustrating gate edge junction leakage currents in pMOS transistors fabricated in accordance with the method of the present invention.

Referring to FIG. 5, the gate edge (P$^+$) junction leakage current present in the LP device is greater, by roughly a factor of one hundred, than that of the NLP device, which strongly indicates that off-state current depends on junction leakage current. Thus, the junction leakage current increases as the channel doping density increases, and as the channel implantation dosage increases, the junction leakage becomes increasingly dominated by the tunneling component, i.e., from the source/drain to the well. To maintain a state where the junction leakage current is less than the off-state current, the maximum channel doping should be limited to approximately $5 \times 10^{18}$ atoms/cm$^3$.

Figure 6:
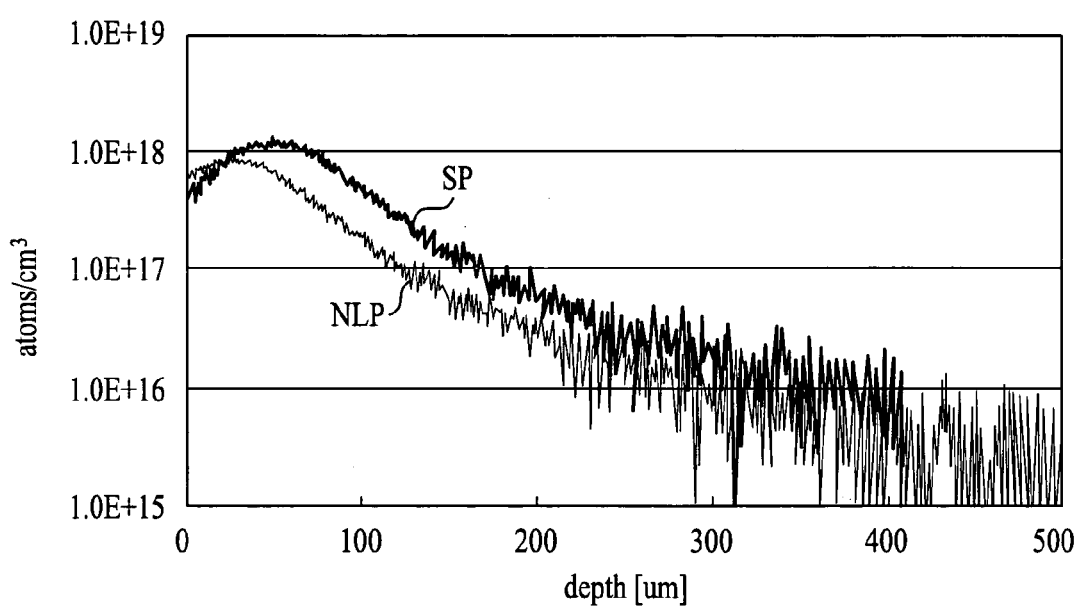
FIG. 6 is a graph representing a secondary ion mass spectrometry profile for arsenic ions (As$^+$) in the N-well of pMOS transistors fabricated in accordance with the method of the present invention.
Figure 7:
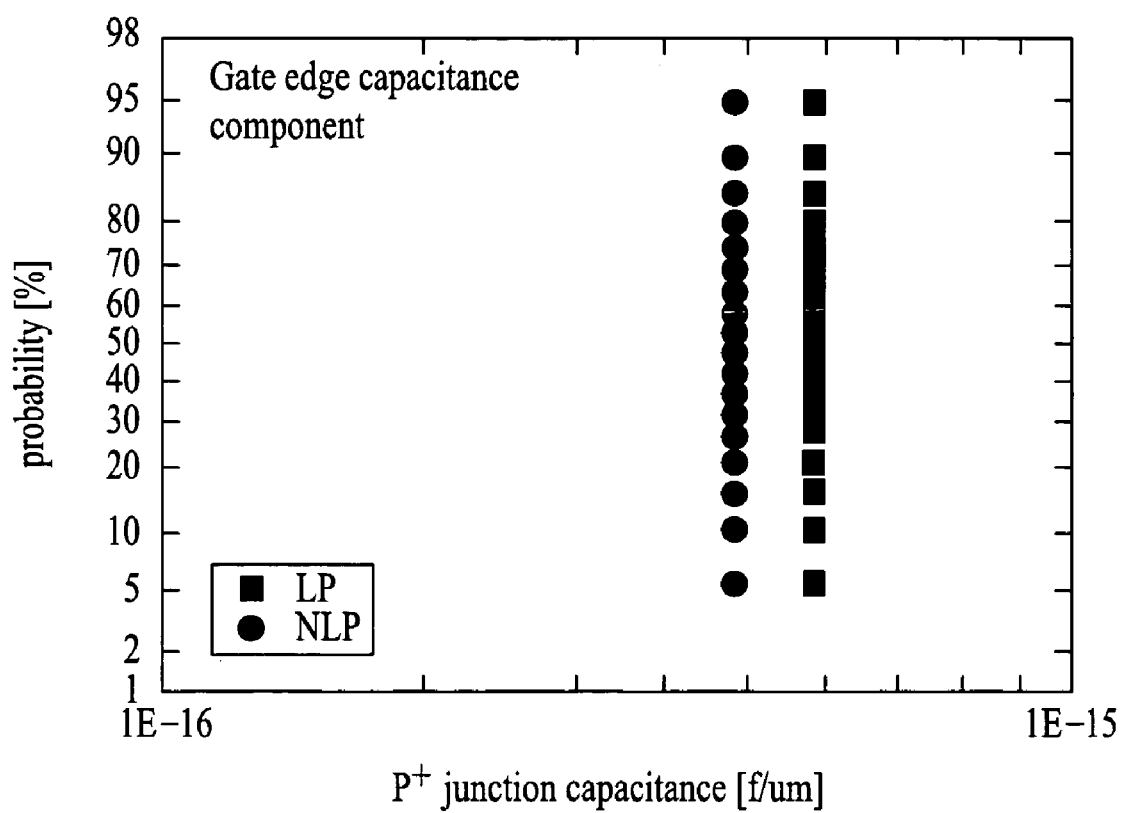
FIG. 7 is a graph for illustrating gate edge junction capacitances in pMOS transistors fabricated in accordance with the method of the present invention.

The main factors for decreasing leakage current in a semiconductor device fabricated by the method of the present invention are the well doping profile and the gate edge (P$^+$) junction capacitance. As shown in FIG. 6, the channel ion implantation layer of the NLP device has a higher density of arsenic ions at the silicon surface (depth=0) than in the LP device but exhibits a lower dosage overall. The lower doping density of the channel ion implantation layer of the NLP device enables a reduction in the junction tunneling leakage current, and with the significantly lowered off-state current of the NLP process, the threshold voltage and the saturation current can be maintained. The gate edge junction capacitance in the NLP device, which has the low channel doping density, is about 15% lower than in the LP device, as shown in FIG. 7.

As described above, by adopting the method for fabricating the semiconductor device according to the present invention, gate edge junction leakage current in a pMOS transistor can be decreased by lowering the channel doping density and the channel implantation energy. Also, gate edge junction capacitance can be improved by lowering the channel doping density, thereby increasing the chip speed of a pMOS transistor fabricated according to the method of the present invention.

It will be apparent to those skilled in the art that various modifications can be made in the present invention without departing from the spirit or scope of the inventions Thus, it is intended that the present invention covers such modifications provided they come within the scope of the appended claims and their equivalents.

What is claimed is:

1. A method for fabricating a semiconductor device, comprising:
    forming a device isolation layer defining an active area in a semiconductor substrate;
    forming a channel ion implantation layer by an implantation of arsenic ions (As$^+$) in a predetermined region of the active area of the semiconductor substrate at a predetermined density; and
    activating the channel ion implantation layer by annealing in a nitrogen (N$_2$) gas ambient of 1.025° C. using a rapid thermal annealing technique.

2. The method of claim 1, wherein the channel ion implantation layer has a controlled doping profile according to the predetermined density of arsenic ion implantation.

3. The method of claim 1, wherein the implantation is a low-density implantation of $1.0 \times 10_{12} \sim 1.5 \times 10_{13}$ atoms/cm$^2$.

4. The method of claim 3, wherein the low-density implantation is performed at an energy level of 10~100 keV.

5. The method of claim 1, wherein the implantation is a low-density implantation of $1.82 \times 10^{13}$ atoms/cm$^2$.

6. The method of claim 5, wherein the low-density implantation is performed at an energy level of 110 keV.

7. The method of claim 1, further comprising:
    forming a photoresist pattern for exposing the predetermined region of the active area of the semiconductor substrate; and
    using the photoresist pattern as a mask when implanting the arsenic ions.

8. The method of claim 1, further comprising:
    forming a gate on the semiconductor substrate to be disposed above the channel ion implantation layer; and
    using the gate as mask to form a source/drain region in the semiconductor substrate.

9. The method of claim 8, wherein the gate used as a mask includes sidewall spacers.

10. The method of claim 8, farther comprising:
    completing a pMOS transistor by forming, subsequent to the gate formation,
    a cobalt salicide layer,
    an interlayer dielectric material, and
    a metallization layer.

11. A method for fabricating a semiconductor device, comprising:
    forming a device isolation layer defining an active area in a semiconductor substrate;
    forming a channel ion implantation layer by an implantation of arsenic ions (As$^+$) in a predetermined region of the active area of the semiconductor substrate at a predetermined density, the channel ion implantation layer having a predetermined doping profile according to the predetermined density of arsenic ion implantation,
    wherein the predetermined doping profile is achieved by a low-density implantation of $1.0 \times 10_{12} \sim 1.5 \times 10_{13}$ atoms/cm$^2$; and
    activating the channel ion implantation layer by annealing in a nitrogen (N$_2$) gas ambient of 1.025° C. using a rapid thermal annealing technique.

12. The method of claim 11, wherein the low-density implantation is performed at an energy level of 10~100 keV.

13. A method for fabricating a semiconductor device, comprising:
    forming a device isolation layer defining an active area in a semiconductor substrate;
    forming a channel ion implantation layer by an implantation of arsenic ions (As$_+$) in a predetermined region of the active area of the semiconductor substrate at a predetermined density, the channel ion implantation layer having a predetermined doping profile according to the predetermined density of arsenic ion implantation,
    wherein the predetermined doping profile is achieved by a low-density implantation of $1.82 \times 10^{13}$ atoms/cm$^2$; and
    activating the channel ion implantation layer by annealing in a nitrogen (N$_2$) gas ambient of 1.025° C., using a rapid thermal annealing technique.

14. The method of claim 13, wherein the low-density implantation is performed at an energy level of 100 keV.

15. A semiconductor device, comprising:
    a semiconductor substrate;
    a device isolation layer defining an active area in the semiconductor substrate; and
    a channel ion implantation layer formed by an implantation of arsenic ions (As$^+$) in a predetermined region of the active area of the semiconductor substrate at a predetermined density, wherein the channel ion implantation layer has a controlled doping profile according to the predetermined density of arsenic ion implantation and is activated by annealing in a nitrogen ($N_2$) gas ambient of 1,025° C. using a rapid thermal annealing technique.

16. The semiconductor device of claim 15, wherein the implantation is a low-density implantation of $1.0\times10_{12}$~$1.5\times10_{13}$ atoms/cm$^2$.

17. The semiconductor device of claim 16, wherein the low-density implantation is performed at an energy level of 10~100 keV.

18. The semiconductor device of claim 15, wherein the implantation is a low-density implantation of $1.82\times10^{13}$ atoms/cm$^2$.

19. The semiconductor device of claim 18, wherein the low-density implantation is performed at an energy level of 110 keV.

20. The semiconductor device of claim 15, wherein the semiconductor device is pMOS transistor.

* * * * *